US00RE40352E

(19) United States
(12) Reissued Patent
Deboy et al.

(10) Patent Number: US RE40,352 E
(45) Date of Reissued Patent: Jun. 3, 2008

(54) SWITCH MODE POWER SUPPLY WITH REDUCED SWITCHING LOSSES

(75) Inventors: Gerald Deboy, München (DE); Franz Hirler, Isen (DE); Martin März, Nuremberg (DE); Hans Weber, Ainring (DE)

(73) Assignee: Infineon Technologies AG, Neublberg (DE)

(21) Appl. No.: 10/846,998

(22) Filed: May 14, 2004

Related U.S. Patent Documents

Reissue of:
(64) Patent No.: 6,388,287
Issued: May 14, 2002
Appl. No.: 09/804,325
Filed: Mar. 12, 2001

U.S. Applications:
(63) Continuation of application No. PCT/DE99/02874, filed on Sep. 10, 1999.

(30) Foreign Application Priority Data

Sep. 11, 1998 (DE) ..... 198 41 754

(51) Int. Cl.
*H01L 29/76* (2006.01)

(52) U.S. Cl. ..... 257/341
(58) Field of Classification Search ..... 257/288, 257/296, 300, 324, 325, 341, 342, 344, 345, 257/367, 409; 323/265, 273, 282
See application file for complete search history.

(56) References Cited

U.S. PATENT DOCUMENTS 4,413,237 A 11/1983 Baba ..... 331/108
5,216,275 A 6/1993 Chen ..... 257/493
5,296,723 A 3/1994 Nobe et al. ..... 257/82
5,438,215 A * 8/1995 Tihanyi ..... 257/401
5,644,148 A 7/1997 Kinzer ..... 257/133
6,057,558 A 5/2000 Yamamoto et al. ..... 257/77
6,097,063 A 8/2000 Fujihira ..... 257/339
6,124,628 A 9/2000 Fujihira et al. ..... 257/630
6,239,466 B1 5/2001 Elasser et al. ..... 257/341
6,380,569 B1 * 4/2002 Chang et al. ..... 257/256
7,005,353 B2 * 2/2006 Kocon et al. ..... 438/270

FOREIGN PATENT DOCUMENTS

DE 19702102 * 7/1997
WO WO97/29518 8/1997

OTHER PUBLICATIONS

Zhang, M. et al.: "Design considerations and performance evaluations of synchrononous rectification in flyback converters"; APEC. Annual Applied Power Electronics Conf. and Expo; New York; pp. 623–630 Feb. 23, 1997.

Fujihira T., et al.: "Theory of Semiconductor Superjunction Devices"; Japanese Journal of Applied Physics, Part 1, vol. 36, No. 10; pp. 6254–6262 Oct. 1997.

* cited by examiner

*Primary Examiner*—Matthew V. Nguyen
(74) *Attorney, Agent, or Firm*—Eschweiler & Associates, LLC

(57) ABSTRACT

The invention relates to a switching transistor presenting reduced switching losses. In the switching transistor, output capacitance is very high when drain/source voltages are low. As the drain/source voltage increases, the capacitance falls to such low values that the energy stored in the transistor becomes very low.

12 Claims, 5 Drawing Sheets

INVENTION

A: Standard-MOSFET
B: Inventive MOSFET

SWITCH MODE POWER SUPPLY WITH REDUCED SWITCHING LOSSES

Matter enclosed in heavy brackets [ ] appears in the original patent but forms no part of this reissue specification; matter printed in italics indicates the additions made by reissue.

CROSS-REFERENCE TO RELATED APPLICATION

This application is a continuation of copending International Application No. PCT/DE99/02874, filed Sep. 10, 1999, which designated the United States.

BACKGROUND OF THE INVENTION

Field of the Invention

The present invention relates to a switch mode power supply having a switching transistor with reduced switching losses.

The term "switch mode power supply" is intended to cover all types of forward converters, flyback converters, half-bridge and full-bridge converters as well as step-up and step-down controllers, such as those used in power supply units, lamp ballasts, welding converters or RF converters.

For some time now, there has been an increasing trend toward system miniaturization and toward increasing the power density in components. It can be excepted that this tendency in power electronics will also be continued in the future. This trend is associated with a development toward even higher switching frequencies, since this is the only way in which passive components can also be miniaturized in a corresponding manner. Furthermore, particularly in the case of industrial generators, power switching transistors in switch mode power supplies are starting to run into frequency bands that have been reserved for electron tubes for a long time. This is to say, for example, frequency bands up to what is referred to as the "ISM" frequency of 13.56 MHz.

As the switching frequency rises, the switching losses in switching transistors become increasingly important. Roughly speaking, these switching losses can be split into three groups:

(a) losses in the switching transistor, which are caused by external, generally parasitic, or non-ideal circuit elements and which could not be avoided even using "ideal" switching transistors;

(b) losses in the switching transistor resulting from an overlapping phase of the current and voltage during the actual switching process; and (c) losses in the switching transistor resulting from the discharging of the switch's own capacitances during the switching-on process.

The switching losses mentioned in item (a) above and which can scarcely be influenced by the switching transistor itself are reduced or are entirely avoided at the moment at high switching frequencies by using special components, such as Schottky, diodes, or by selecting circuit topologies without any critical communication processes, such as resonant converters. Losses such as these also include, for example, the power loss caused by the recovery charge when the current is actively switched off by pn-diodes.

The other switching losses, as mentioned in items (b) and (c) above, can be influenced significantly by the characteristics of the switching transistor and its actuation. For example, the current-voltage overlap losses are dependent to a major extent on the duration of the switching process itself.

For illustrative purposes, FIG. 2a shows the profiles of the drawing current $I_d$ and of the drain-source voltage $U_{ds}$ of a MOSFET power switch 1 (see FIG. 1) as an example of a switching transistor when an inductive load 2 is being switched off. A switching process with a switching time T starts with a decrease in the control gate voltage $V_{gs}$, as a result of which the resistance of the power switch 1 rises. However, the inductive load 2 forces the current $I_d$ to continue to flow, with the consequence that the drain-source voltage $U_{ds}$ also rises with the resistance, until the full load current $I_d$ can be carried by another circuit path, for example, a free wheeling diode 3. This means that, throughout the entire phase in which the voltage $U_{ds}$ across the power switch 1 is rising, the full load current $I_d$ is still flowing via the power switch 1. The area 6 under the product of the switch current and voltage (shown shaded) corresponds to the switching energy loss produced in the power switch 1. Although this area can be reduced by shortening the switching time T it cannot, however, be reduced to zero in practice.

Because of the high gate charge of present-day power switches, in particular MOSFETs, high switching speeds demand very high driver currents, so that reducing the switching times T frequently runs into limits just for cost reasons.

A capacitor 4 with an external capacitance $C_{ext}$ is therefore provided in parallel with the power switch 1 to relieve the switching-off load. Consideration has also already been given to use the MOSFET's own output capacitance for reducing the switching load (see B. Carsten: "FET selection and driving considerations for zero switching loss and low EMI in HF "Thyristor dual" power converters", Power Conversion 1996, Conference Proceedings 5/96, pages 91-102).

As can be seen from FIG. 2(b), the capacitor 4 with the capacitance $C_{ext}$ slows down the rise in the voltage $U_{ds}$. At the same time, two current paths are produced, with a current $I_{ch}$ via the channel of the MOSFET which forms the power switch, and a current via the capacitor 4. Since the current $I_{ch}$ can now be switched off very quickly—without causing any rise in the drain-source voltage $U_{ds}$ (no "Miller" effect, see the gate-drain capacitance $C_{gd}$ in FIG. 1), the overlapping area of the current $I_{ch}$ and the drain-source voltage $U_{ds}$, and thus the switching-off energy loss (see the area 6) can be reduced virtually indefinitely.

However, circuitry such as this is suitable only for circuits in which the power switch is switched on at zero voltage (zero voltage switching ZVS), since, otherwise, the losses are just moved from the switching-off to the switching-on process. Specifically, when switching on at a time when voltage is present, the energy stored in the external capacitor 4 and the energy stored in the output capacitance are converted into heat losses in the power switch 1 [see the shaded area 5 in FIGS. 2b and 2c, which corresponds to the time integral of the product of the voltage $U_{ds}$ and the current $(I_{oss})*(C_{ext})$, where $I_{oss}$=output current and $C_{oss}=C_{gd}+C_{ds}$]. The vast majority of standard circuits have to be switched on when the voltage is present, however. In this situation, until now, it has been possible to achieve switching-off load relief only by using complex circuitry, which in general, also produces losses for the power switch or switching transistor.

No satisfactory solution has yet been found to avoid the above switching losses.

SUMMARY OF THE INVENTION

It is accordingly an object of the invention to provide a switch mode power supply having a switching transistor which overcomes the above-mentioned disadvantageous of the prior art apparatus of this general type, and which, in particular, is distinguished by drastically reduced switching losses.

With the foregoing and other objects in view there is provided, in accordance with the invention, A switch mode power supply that includes a switching transistor having a load path formed by a first main connection and a second main connection. The first main connection and the second main connection are provided for receiving a voltage applied thereto. The switching transistor includes a semiconductor body with a semiconductor layer of a first conductance type forming a drift area. A load is connected in series with the load path of the switching transistor. A continuous drain region of a second conductance type is incorporated into the drift area and is connected to the first main connection. A continuous source region of the second conductance type is incorporated into the drift area and is connected to the second main connection. A reverse-biased pn-junction is produced by an interaction between the semiconductor body and the continuous drain region and between the semiconductor body and the continuous source region. The reverse-biased pn-junction has a large inner voltage-dependent surface area that is variable as a function of the voltage applied to the first main connection and the second main connection. When the voltage applied is 10 V, the switching transistor is characterized by a first product of a switch-on resistance $R_{on}$ and a gate charge $Q_{gtot}$, the first product given by: $R_{on}*Q_{gtot}/10\ V \leqq 2.5$ ns. When the voltage applied is 400 V, the switching transistor is characterized by a second product of the switch-on resistance $R_{on}$ and the energy $E_{ds}$ stored in a drain-source capacitance, the second product given by $R_{on}*E_{ds} \leqq 1.6\ V^2\ \mu s$.

In other words, the switch mode power supply has a switching transistor with a first and a second main connection forming a load path. A load is connected in series with the load path of the switching transistor. The switching transistor has a semiconductor body with a semiconductor layer of the first conductance type into which continuous regions of the second conductance type are incorporated which, interacting with the semiconductor body at the reverse-biased pn-junction which is formed, create a large inner, voltage-dependent source area. The surface area is varied as a function of a voltage applied to the main connections.

In accordance with an added feature of the invention, the switching transistor is in the form of a MOSFET. The output capacitance values for low drain-source voltages (for example less than 45 V for high-voltage MOSFETs) are very high, with this capacitance decreasing, as the drain-source voltage rises, to values which are so low that the energy stored in the transistor assumes very low values.

In accordance with an additional feature of the invention, the voltage-dependent surface area of the pn-junction is reduced as the voltage applied is increased.

In accordance with another feature of the invention, an amount of charge in the switching transistor, which is calculated via a line integral along a line at right angles to the pn-junction, remains below a material-specific breakdown charge.

In accordance with a further feature of the invention, the continuous drain region of the second conductance type and the continuous source region of the second conductance type are configured in a structure selected from the group consisting of a vertical structure and a lateral structure.

In accordance with a concomitant feature of the invention, a charge storage device is connected in parallel with the load path of the switching transistor.

Other features which are considered as characteristic for the invention are set forth in the appended claims.

Although the invention is illustrated and described herein as embodied in a switch mode power supply with reduced switching losses, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
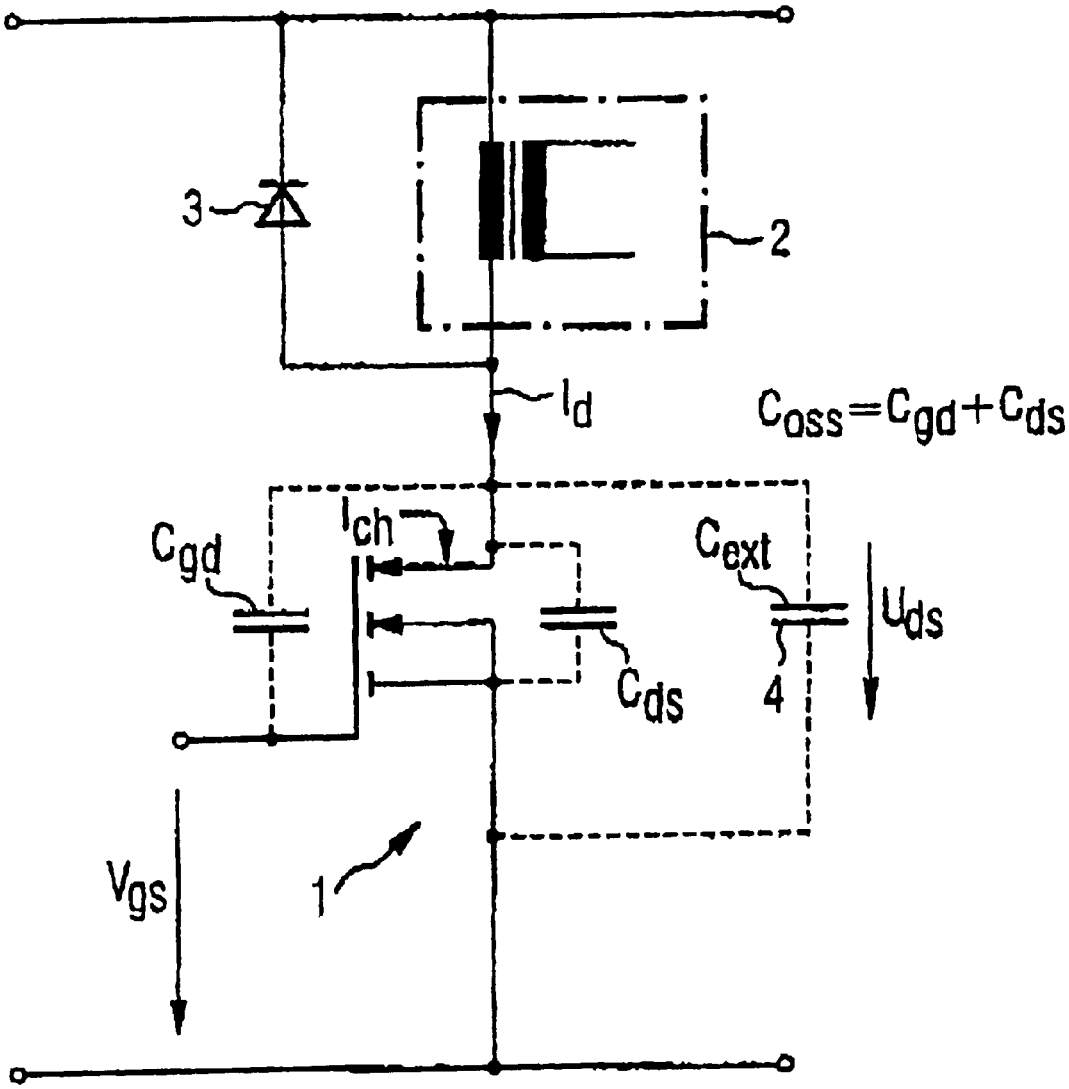
FIG. 1 shows a basic functional unit of a switch mode power supply.

Referring now to the figures of the drawing in detail and first, particularly, to FIG. 1 thereof, there is schematically shown the basic structure of a switch mode power supply (without the capacitor 4 and the free wheeling diode 3) with a power switch 1 that is designed according to the invention and that is in the form of a MOSFET with, for example, an inductive load 2 is connected in series.

In order to reduce the switching losses in comparison to the prior art, the MOSFET of the power switch 1 specifically has the following characteristics:

(a) low gate charge for a high switching speed with a low driver power;

(b) low energy content in the output capacitance for low switching-on losses; and (c) "no-loss" delay of the voltage rise after switching off.

Figure 2A:
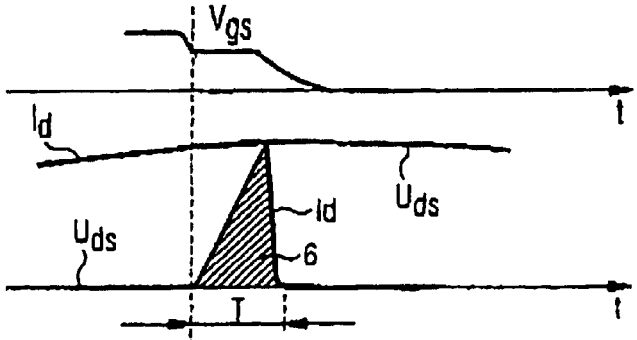
FIG 2A PRIOR ART
FIGS. 2a and 2b show current and voltage profiles for exiting switch mode power supplies.
Figure 2B:
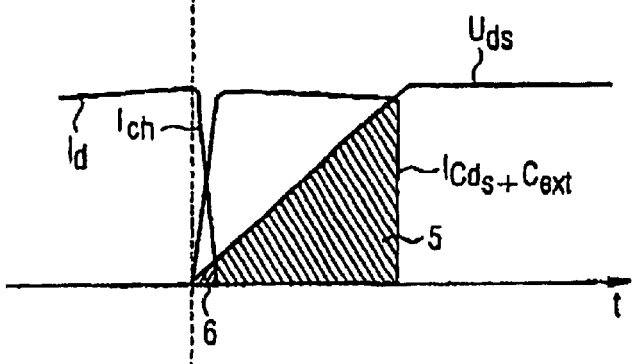
FIG 2B PRIOR ART
Figure 2C:
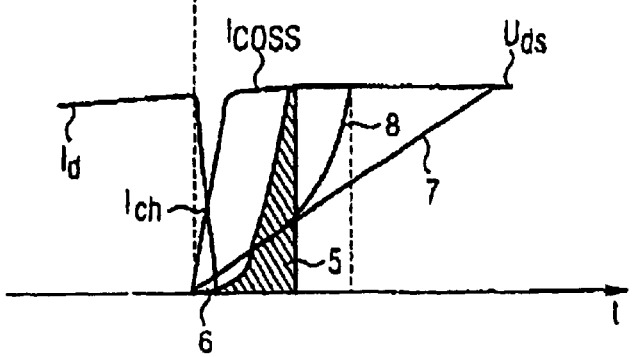
FIG. 2c shows current and voltage profiles for the invention switch mode power supply disclosed herein.

None of the currently available power switches can satisfy the characteristics (b) and (c) at the same time. However, this can actually be achieve by the present invention since, as is shown in FIG. 2c, the switching transistor or power switch 1 has an extremely non-linear profile of the drain-source capacitance $C_{ds}$. Very high values for $C_{ds}$ for low drain-source voltages $U_{ds}$ result in the desired delay of the voltage rise after switching off the MOSFET channel. The load current thus changes from initially being the channel current $I_{ch}$ to being the charge current of the output capacitance $C_{oss}$. The delay in the voltage rise also makes it possible to achieve virtually zero-loss switching-off with a finite driver power and thus a finite switching-off rate.

In the switching transistor according to the invention, the drain-source capacitance $C_{ds}$ falls very rapidly to very low values as the drain-source value $Ud_s$ rises, so that the energy stored in the drain-source capacitance $C_{ds}$:

$$E_{ds}(U_{max})=\int_o^{Umax} C_{ds}(U)\cdot U\cdot dU \quad \text{(equation 1)}$$

for the envisaged operation voltage remains less than with conventional MOSFETs. In this way, not only are the switching-off losses reduced, but also the switching-on losses when switching with voltage applied. In the case of tuned circuits, the small amount of energy in the drain-source capacitance $C_{ds}$ of the power switch in the switching transistor according to the invention advantageously reduces the communication energy required for zero voltage switching.

In comparison with present-day MOSFETs, a transistor with optimized power loses has particularly low products of the switch-on resistance $R_{dx(on)}$ and the gate charge $Q_{gtot}$, and also of the switch-on resistance and stored energy $E_{ds}$, and in consequence, achieves extraordinarily low switching losses. For example, for 600 V MOSFETs, the product $R_{on}*E_{ds}$ (400 V) is preferably $\leqq 1.6\ V^2\ \mu s$ and the product $R_{on}*Q_{gtot}$ (10 V)/10 V is preferably $\leqq 2.5$ ns. The bracketed expressions (400 V) etc. indicate the applied voltages.

The extremely non-linear capacitance profile of the power switch 1 furthermore leads to a soft switching edge, which has few harmonics an is advantageous from the EMC point of view. As illustrated in FIG. 2c, the switching edge is advantageously "rounded" but is not excessively extended, as would be the case if a discrete capacitor (curve 7) or a conventional MOSFET with a high output capacitance (curve 8) were to be used. Lengthening of the switching edges in general limits the minimum duty ration, and in consequence leads to problems in the system during low-load operation.

The stated non-linear capacitance profile can be noticed particularly advantageously in bridge circuits since in this case—because of the very high capacitance values for low drain-source voltages—both the lower and the upper "corner" of the voltage edge are rounded.

To a first approximation, the output capacitance $C_{oss}$ corresponds to the capacitance $C_{ds}$ and $C_{gd}$ connected in parallel. In this case, $C_{gd}$ should remain as low as possible in order to minimize the reaction ("Miller" effect).

The desired high value of the drain-source capacitance $C_{ds}$ can be achieved in a power switch by deliberately increasing the surface area of the reverse-biased pn-junction. Technically speaking, structures such as this can be produced by inserting, for example, the p-conductive regions in the n-conductive drift path of the semiconductor power switch. The reverse-biased pn-junction must in this case have a continuous inner surface area, that is to say all of the p-regions must be conducively connected to one another. The majority of the output capacitance in such a configuration results from the drain-source capacitance. In order to keep the amount of energy stored in the power switch as low as possible, the output capacitance must assume very low values at high voltages, as shown in Equation 1.

In MOSFETs, there is admittedly a capacitance reduction, which is inversely proportional to the square root of the drain-source voltage $U_{ds}$ and reflects the increases (when considered in one dimension) in the width of the space-charge zone.

However, it is necessary to reduce the surface area of the reverse-biased pn-junction as the voltage rises if a considerably more rapid reduction in the drain-source capacitance $C_{ds}$ is to be achieved. If the doping and dimensions of the p-regions incorporated in the drift zone are dimensioned such that their charge is depleted by the opposite charge of the surrounding semiconductor material by transverse electrical fields at low voltages, then this results in a rapid reduction in the surface area as the voltage rises. The dimensioning must in this case be such that the line integral of the doping of the p-regions at right angles to its surface remains below the material-specific breakdown charge. The depletion voltage in this case becomes less, the shorter the distances between the semiconductor regions of opposite conductance type.

The above condition does not demand complete compensation for the basic material, and in fact, the principle also operates with incomplete compensation. In the event of overcompensation, on the other hand, an additional vertical electrical field is required in order to deplete the p-regions. The steep drop in the drawin-source capacitance is thus moved to higher voltages.

The abovementioned principle can likewise be used in the field of low blocking-capability transactors.

Figure 3:
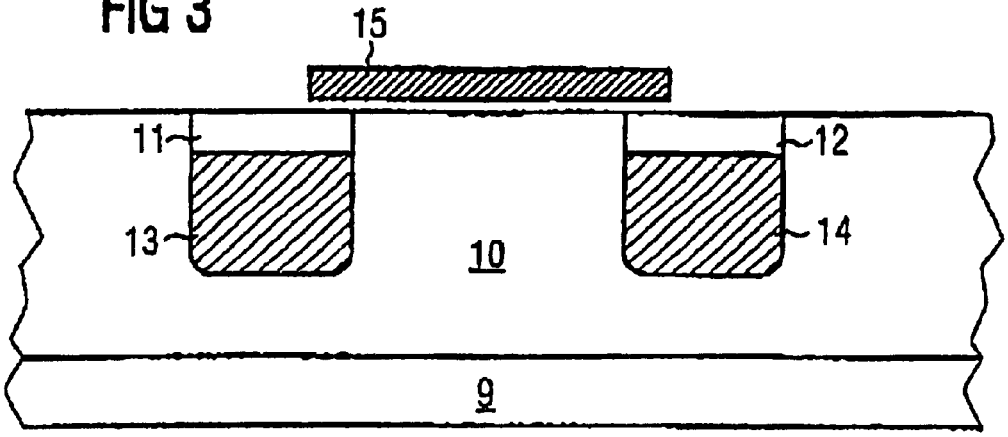
FIG. 3 shows a section through a MOSFET that can be used for the inventive switch mode power supply.

FIG. 3 now shows the inventive MOSFET which can be used as a power switch in a switch mode power supply.

A silicon semiconductor layer 10, which is, for example, between 4 and 50 μm thick is located on an $n^+$-doped silicon semiconductor substrate 9. A $p^-$-conductive source zone 11 and a $p^-$-conductive drain zone 12, which each have a penetration depth of about 2 μm, are embedded in the silicon semiconductor layer 10. Underneath the source zone 11 and drain zone 12, a p-conductive region 13 or 14, respectively, with a penetration depth of 4 to 40 mm is formed, so that it ends at a distance of about 1 to 10 mm from the semiconductor substrate 9. The higher values above apply to high-voltage components, while the lower values are appropriate for low-voltage components.

Another gate electrode 15 is provided between the source and drain zones 11 and 12, respectively.

The indicated conductance types can, of course, also in each case be reversed. It is also possible to use lateral structures instead of vertical structures.

Figure 4A:
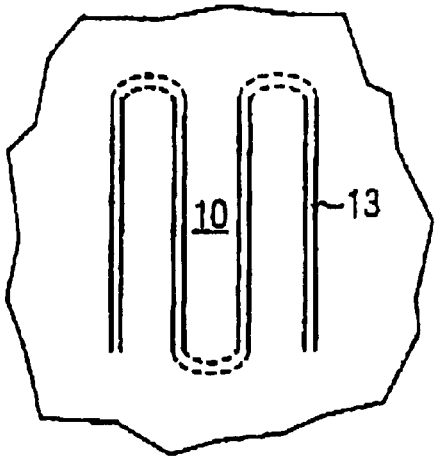
FIGS. 4a to 4c shows possible layouts for the MOSFET shown in FIG. 3.
Figure 4B:
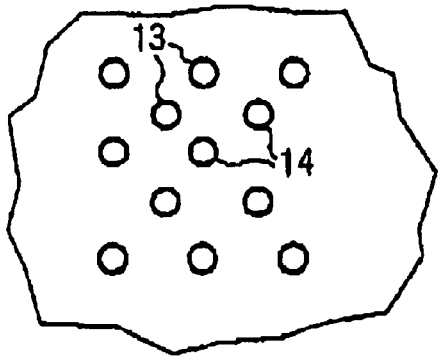
Figure 4C:
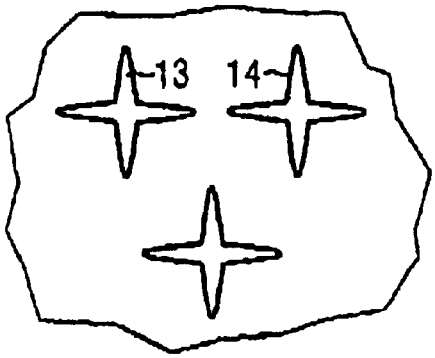

FIGS. 4A to 4C show further possible structures for the p-conductive regions 13 and 14: these are finely structured and are each composed of, for example, narrow plates (FIG. 4A) which may be continuous in a meandering shape; columns configured in a square or hexagon (FIG. 4B); or leaf-shaped configurations configured in squares or hexagons (FIG. 4C), which are connected to one another via a common electrode.

Figure 6A:
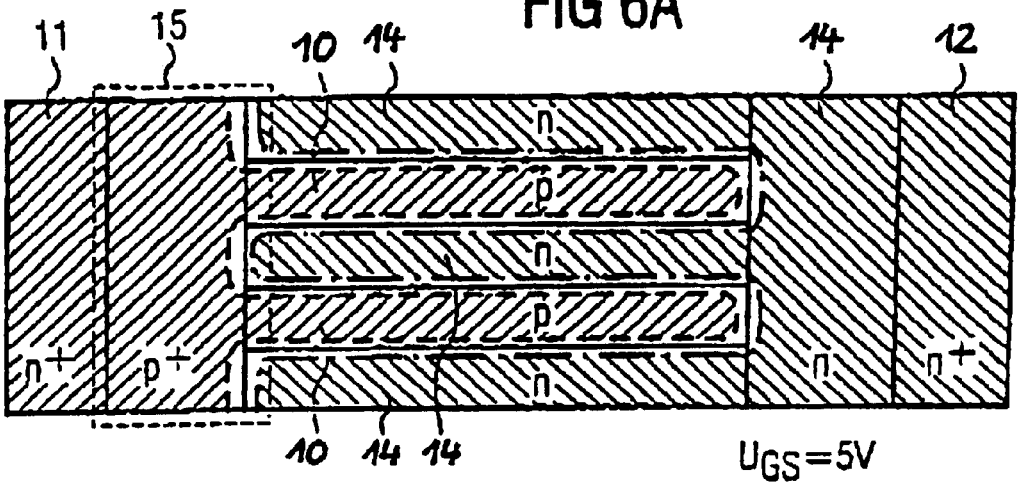
FIGS. 6a to 6c show a plan view through a MOSFET which can be used for the inventive switch mode power supply and in which the reverse-biased pn-junction is shown for various voltages.
Figure 6B:
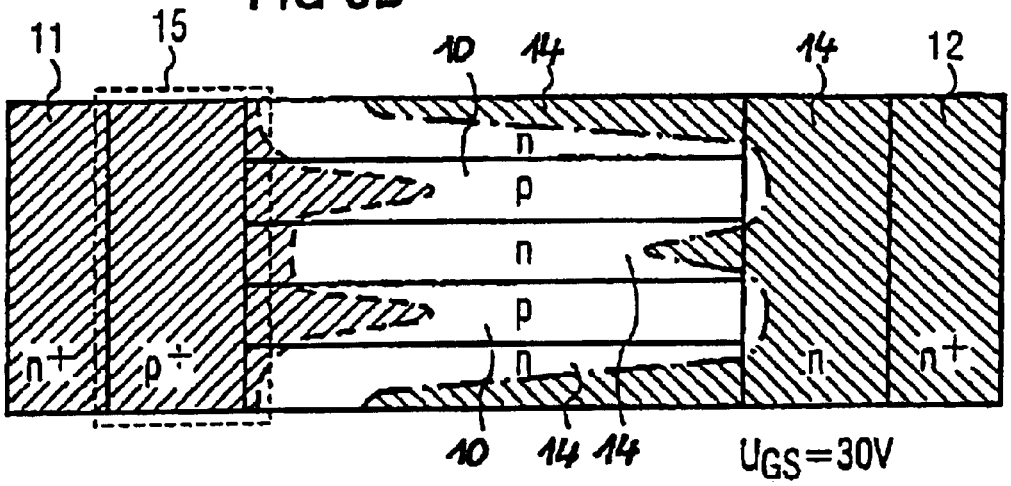
Figure 6C:
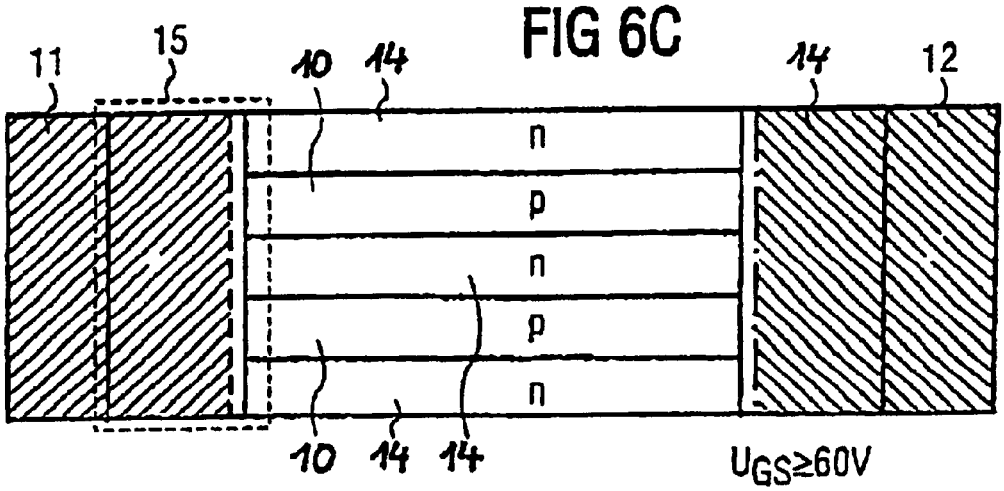

The configuration of n-conductive continuous regions 14 in a p-conductive semiconductor layer 10 is shown in a plan view in FIGS. 6A to 6C.

In the exemplary embodiments, the regions 13, 14 are in the form of strips. The MOSFET is shown laterally in the illustration. The reference numeral 12 denotes the drain zone, and the reference number 11 denotes the source zone. The gate electrode 15 is indicated by dashed lines. The n-conductive regions 14 are incorporated in the p-conductive semiconductor layer 10. The profile of the space-charge zone for various drain-source voltages is also shown in FIGS. 6A to 6C. The higher the drain-source voltage, the broader is the space-charge zone. In consequence, the surface area of the reverse-biased pn-junction is reduced as the voltage rises.

The invention makes it possible to produce a switch mode power supply with reduced switching losses using a MOSFET power switch 1. The output capacitance $C_{ds}$ of the MOSFET power switch 1 falls quickly to low values as a function of the drain-source voltage $U_{ds}$, such that a load current $I_d$ applied to the MOSFET power switch 1 changes from initially being the channel current of the MOSFET power stitch 1 to being the charge current of the output capacitance $C_{oss}$.

Figure 5:
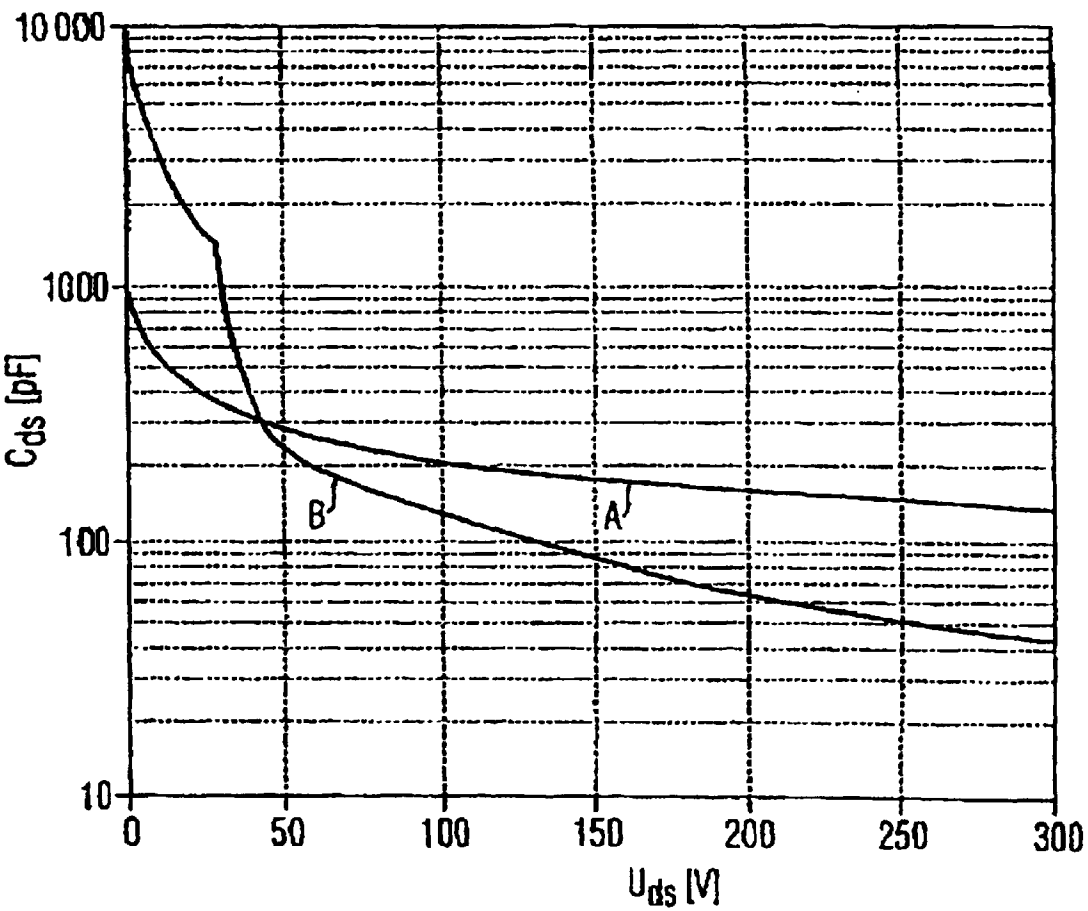
FIG. 5 shows the profile of the drain-source capacitance $C_{ds}$ as a function of the drain-source voltage $U_{ds}$ for a standard MOSFET and for the inventive switching transistor.

FIG. 5 shows the considerable advantages which can be achieved with the present invention, using an example of a 600 V switching transistor with an active chip area of 20 $mm^2$ (190 mΩ): at low drain-source voltages $U_{ds}$, below about 40 V, the drain-source capacitance is considerably greater (see curve B) than with the prior art (see curve A) while, at higher drain-source voltages, the drain-source capacitance of the switching transistor according to the invention is considerably less than the corresponding values for the existing transistor.

We claim:

1. A switch mode power supply, comprising:

a switching transistor having a load path formed by a first main connection and a second main connection, said first main connection and said second main connection for receiving a voltage applied thereto, said switching transistor including a semiconductor body with a semiconductor layer of a first conductance type [forming a drift area];

a load connected in series with said load path of said switching transistor;

a continuous drain region of a second conductance type incorporated into said [drift area] *semiconductor layer* and connected to said first main connection;

a continuous source region of the second conductance type incorporated into said [drift area] *semiconductor layer* and connected to said second main connection;

a reverse-biased pn-junction produced by an interaction between said semiconductor [body] *layer* and said continuous drain region and between said semiconductor [body] *layer* and said continuous source region;

said reverse-biased pn-junction having a large inner voltage-dependent surface area that is variable as a function of the voltage applied to said first main connection and said second main connection;

when the *gate to source* voltage applied is 10 V, said switching transistor is characterized by a first product of a switch-on resistance $R_{on}$ and a gate charge $Q_{gtot}$, the first product given by: $R_{on}*Q_{gtot}/10\ V \leqq 2.5$ ns; and when the *drain to source* voltage applied is 400 V, said switching transistor is characterized by a second product of the switch-on resistance $R_{on}$ and energy $E_{ds}$ stored in a drain-source capacitance, the second product given by $R_{on}*E_{ds} \leqq 1.6\ V^2\ \mu s$.

2. The switch mode power supply according to claim 1, wherein said voltage-dependent surface area of said pn-junction is reduced as the voltage applied is increased.

3. The switch mode power supply according to claim 2, wherein an amount of charge in said switching transistor, which is calculated via a line integral along a line at right angles to said pn-junction, remains below a material-specific breakdown charge.

4. The switching transistor according to claim 3, wherein said continuous drain region of said second conductance type and said continuous source region of said second conductance type are configured in a structure selected from the group consisting of a vertical structure and a lateral structure.

5. The switch mode power supply according to claim 1, comprising a charge storage device connected in parallel with said load path of said switching transistor.

*6. The switch mode power supply according to claim 1, wherein the drain region and the semiconductor layer comprise areas which are nested in each other.*

*7. The switch mode power supply according to claim 6, wherein the nested areas form strips of alternating conductivity type.*

*8. The switch mode power supply according to claim 1, wherein the drain region and/or the source region have a meandering shape.*

*9. The switch mode power supply according to claim 1, wherein the drain region and/or the source region each comprise a plurality of columns.*

*10. The switch mode power supply according to claim 9, wherein the columns have a square shape.*

*11. The switch mode power supply according to claim 9, wherein the columns have a hexagon shape.*

*12. The switch mode power supply according to claim 9, wherein the columns are leaf-shaped.*

* * * * *